(12) United States Patent
Miyakawa

(10) Patent No.: US 6,365,957 B1
(45) Date of Patent: Apr. 2, 2002

(54) LATERAL BIPOLAR TRANSISTOR

(75) Inventor: Hiroyuki Miyakawa, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/643,770

(22) Filed: Aug. 22, 2000

(30) Foreign Application Priority Data

Mar. 27, 2000 (JP) ........................................ 2000-087463

(51) Int. Cl.[7] .............................................. H01L 29/00
(52) U.S. Cl. ..................... 257/557; 257/511; 257/512; 257/517; 257/557; 257/560; 257/561; 257/593
(58) Field of Search ................................. 257/510–515, 257/517, 526, 557, 560–561, 563, 593

(56) References Cited

U.S. PATENT DOCUMENTS 4,196,440 A * 4/1980 Anantha et al. ................ 35/35
4,546,536 A * 10/1985 Anantha et al. .............. 25/571

FOREIGN PATENT DOCUMENTS

JP          7 263565        * 10/1995

* cited by examiner

Primary Examiner—Nathan Flynn
Assistant Examiner—Ahmed N. Sefer
(74) Attorney, Agent, or Firm—Oblon, Spivak, McClelland, Maier & Neustadt, P.C.

(57) ABSTRACT

An object of the present invention is to provide a lateral bipolar transistor having a high current driving capacity and a high current amplification factor as well as a high cut-off frequency.

A device area 13 surrounded by an isolating insulation layer is formed on the surface of a semiconductor substrate 11. A base area 15 is formed in the device area 13 to a specified depth from the surface of the semiconductor substrate 11. A core insulation layer 25 is formed in the base area 15 with a depth shallower than the base area 15 from the surface of the semiconductor substrate 11. Around the core insulation layer 25, there are formed emitter areas 26. A collector area 17 is formed at a specified distance from the emitter area 26. Since the bottom area of the emitter area 26 is reduced by being provided with the core insulation layer 25 without reducing the side area of the emitter area 26, the current driving capacity and the current amplification factor of the transistor are thus improved. The junction capacity of the transistor is also decreased so that the cut-off frequency may be increased.

16 Claims, 11 Drawing Sheets

FIG. 3
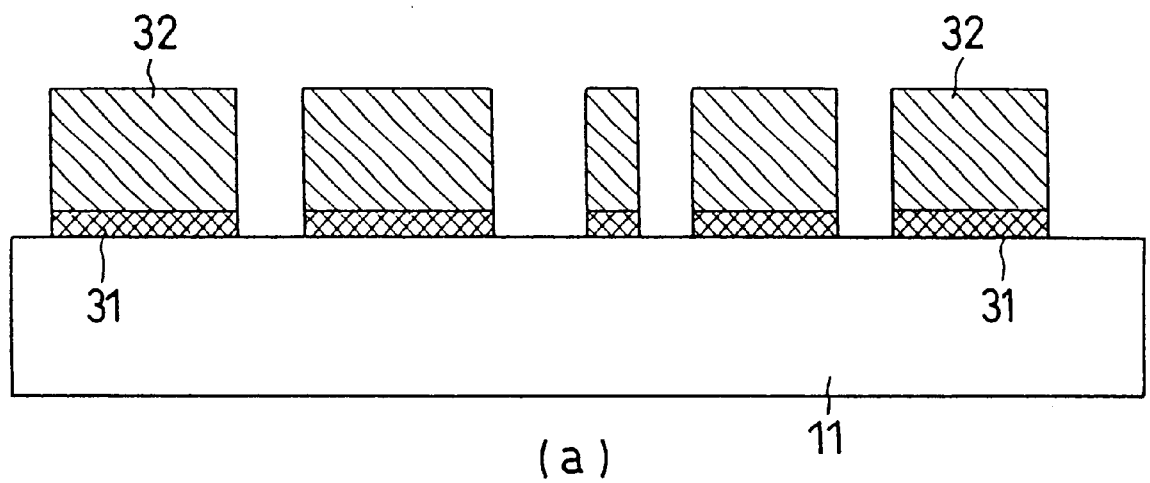
(a)
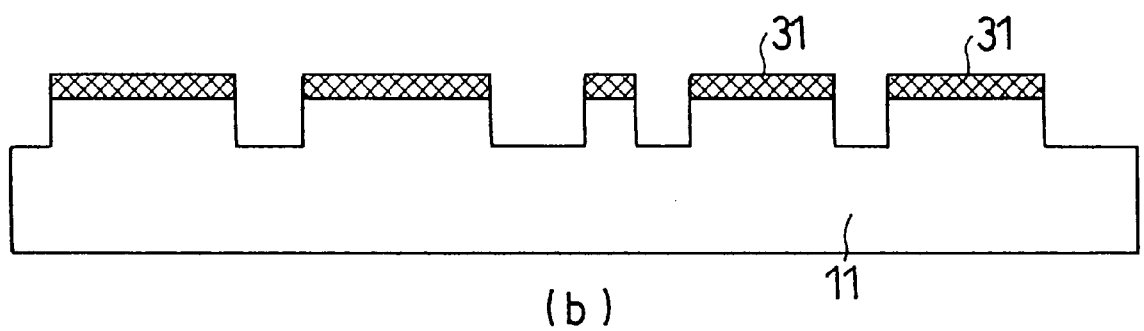
(b)
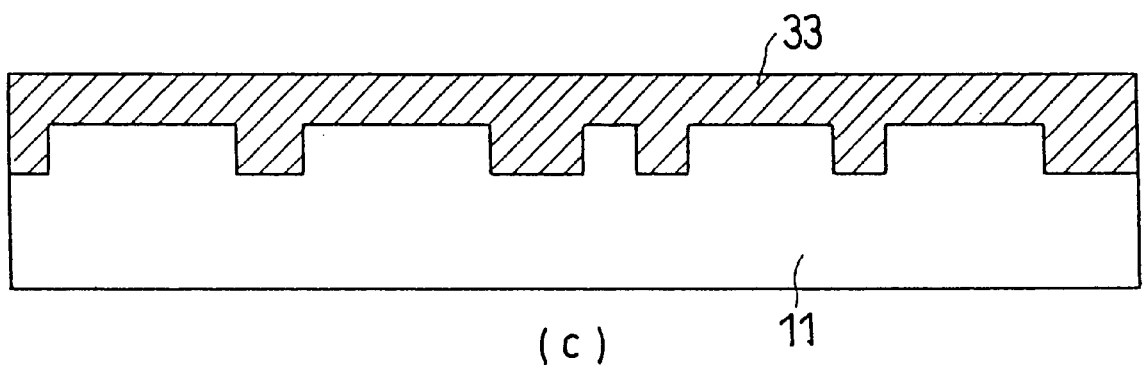
(c)

FIG. 3
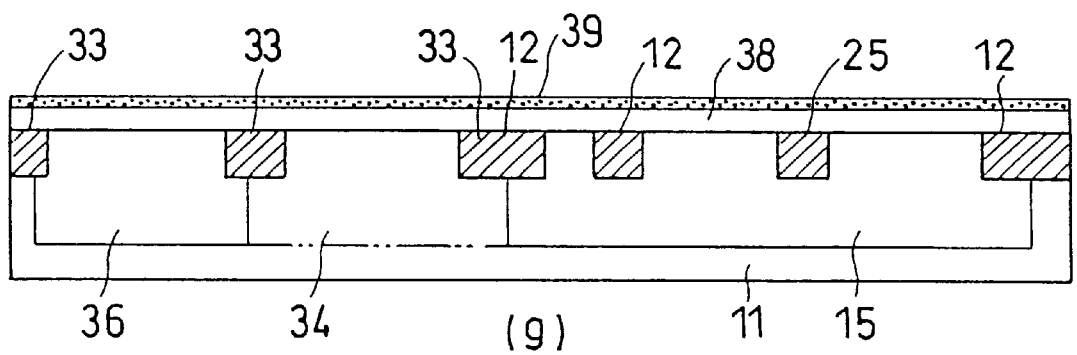
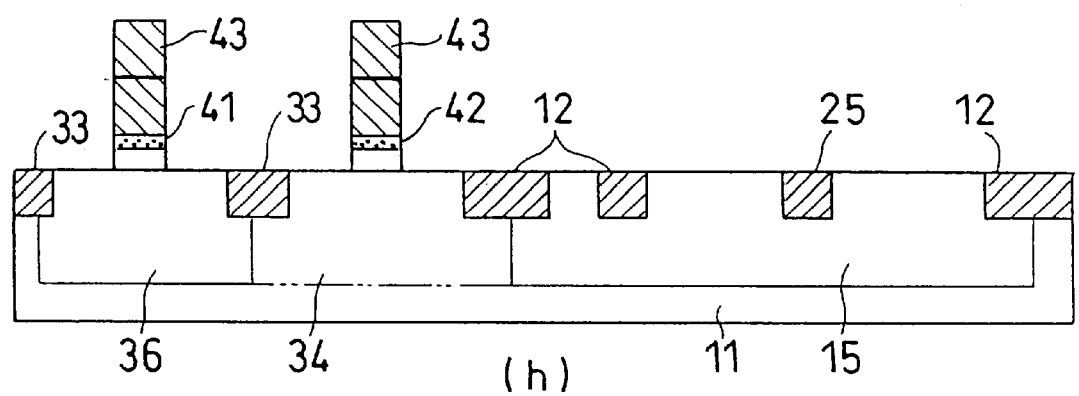
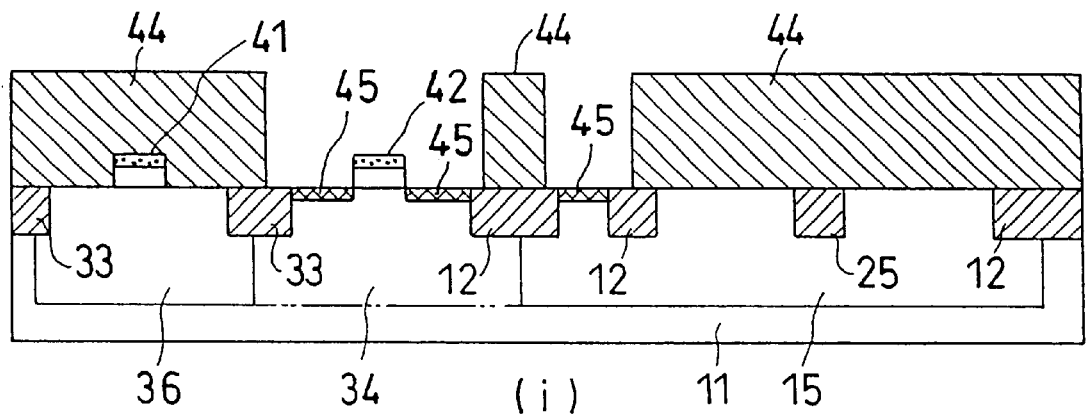

FIG. 3
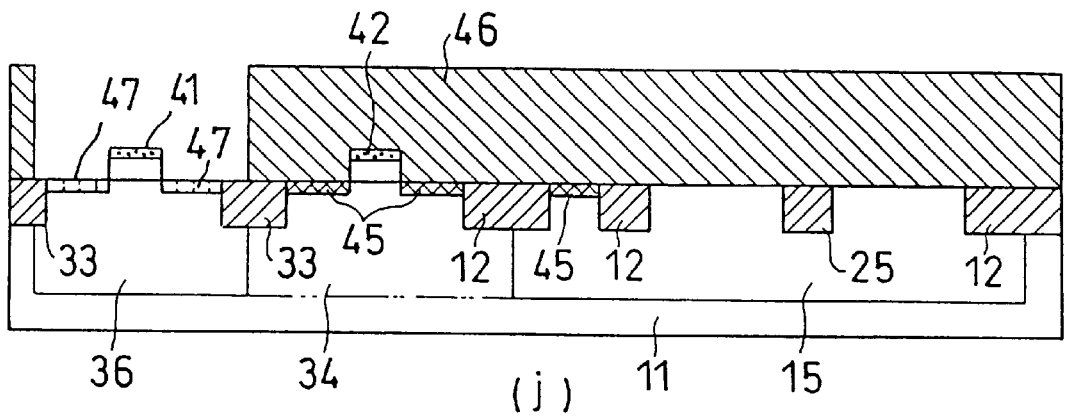
(j)
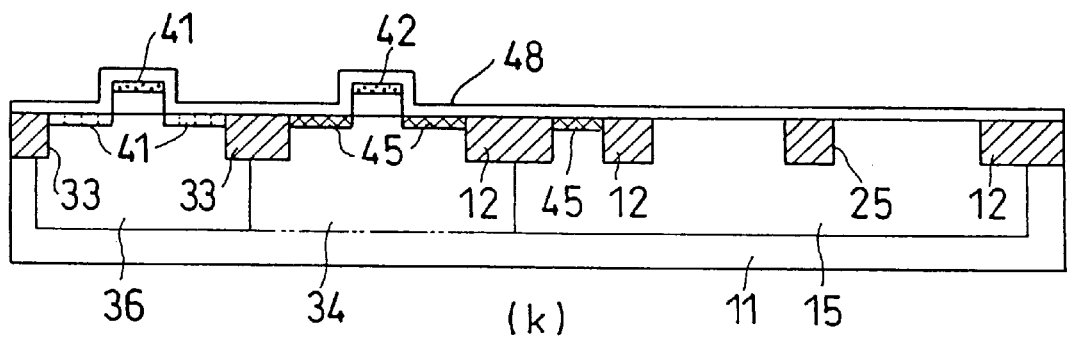
(k)
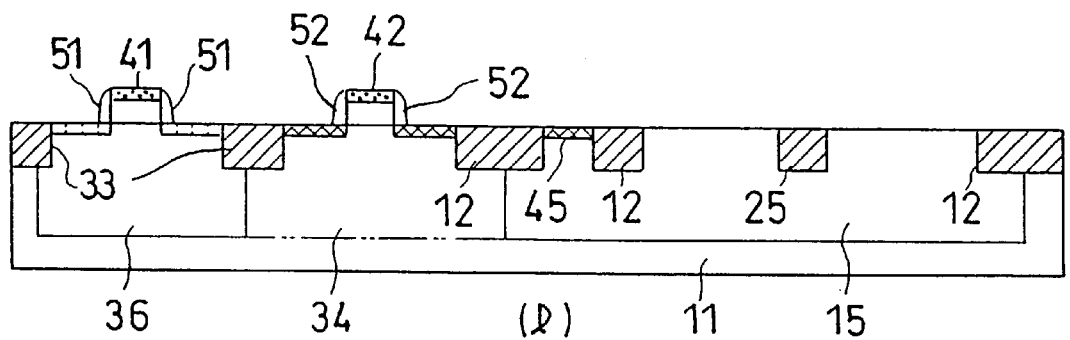
(l)

FIG. 3
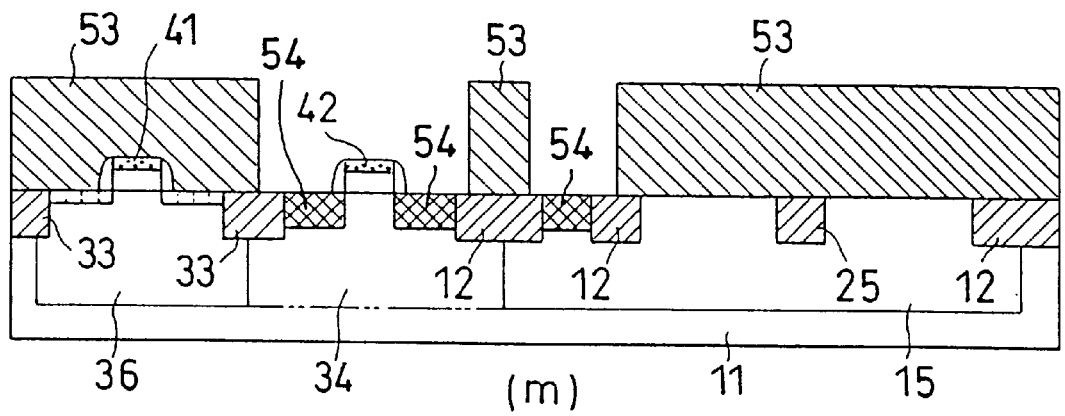
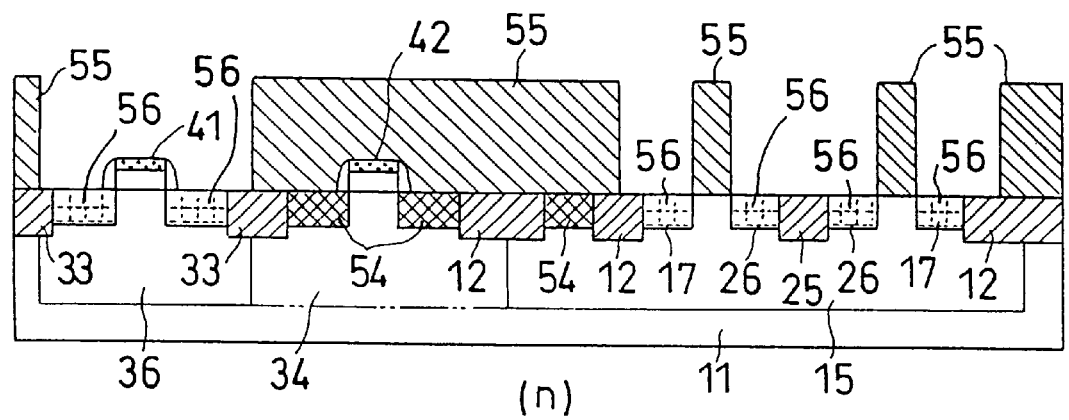
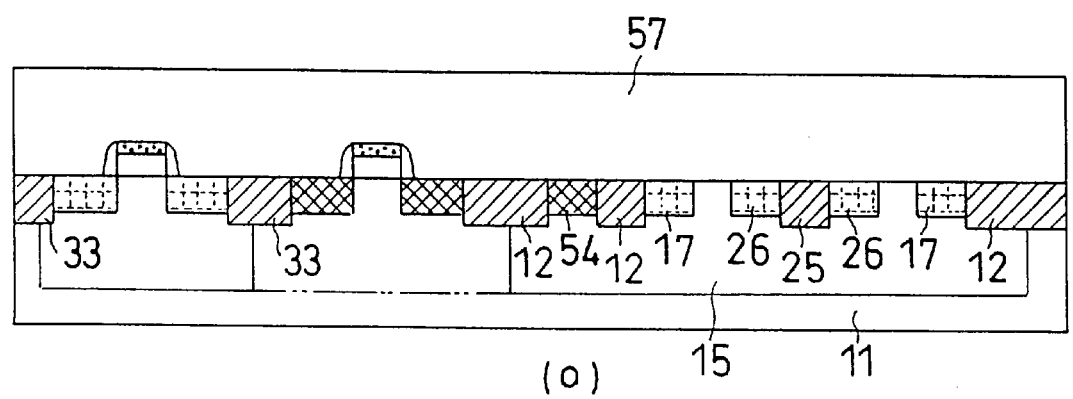

(p)

LATERAL BIPOLAR TRANSISTOR

BACKGROUND OF THE INVENTION

The present invention relates to a bipolar transistor and more particularly to a lateral bipolar transistor that are used in bi-CMOS or CMOS integrated circuits.

A lateral bipolar transistor have less steps and lower costs in its manufacturing process than a vertical bipolar transistor that are used in analog circuits and therefore, are used as power circuits and high-frequency amplifying devices in bi-CMOS or CMOS integrated circuits.

The structure of a conventional lateral bipolar transistor is shown in FIG. 1. FIG. 1(A) is a plan view and FIG. 1(B) is a sectional view along a dotted chain line A–A' shown in FIG. 1(A). Here, a PNP transistor is shown as an example.

On a P-type semiconductor substrate 11, a square device area 13 and a rectangular base contact area 14 are formed which are surrounded by an isolating insulation layer 12 formed at a specified depth from a surface of the semiconductor substrate 11. In the device area 13 and the base contact area 14, an N-type base area 15 is formed on the entire areas. The base area 15 is formed to a depth deeper than the thickness of the insulation layer 12 from the surface of semiconductor substrate 11 and its lower end is turned over to the bottom surface of the insulation layer 12, forming one well area as a whole as shown in FIG. 1(B).

Next, on the central portion of the device area 13, a square P-type emitter area 16 is formed as shown in FIG. 1(A). This emitter area is formed in a depth shallower than the thickness of the insulation layer 12 from the surface of the semiconductor substrate 11 as shown in FIG. 1(B). Accordingly, the P-type emitter area 16 is formed in the N-type base area 15. Further, in the device area 13 around the emitter area 16, a P-type collector area 17 is formed with a specified space from the emitter area 16. The collector area 17 is formed with the same thickness as the emitter area 16 in the N-type base area 15.

On the surface of the semiconductor substrate 11 where the base area 15, the emitter area 16 and the collector area 17 are thus formed, an oxide film 18 is formed for protecting the surface. Contact holes are formed on an oxide film 18 through which base electrodes 19, an emitter electrode 20 and collector electrodes 21 are formed.

The operation of a conventional lateral PNP transistor in this structure will be explained.

Carriers injected from the emitter area 16 into the base area 15 is diffused in the base area 15 and reaches the collector area 17. An emitter-base junction surface is formed by a side surface and a bottom surface of the emitter area 16. The operation of a lateral PNP transistor is primarily contributed by an side area facing the collector area 17. In other words, a current value I injected from the emitter is a sum of a current value IL flowing from the side surface of the emitter area 16 to the collector area 17 and a current value IV that is diffused in the base area 15 from the bottom of the emitter area 16 and flowing into the base electrode 19. However, the current attributing to the operation of the transistor is mainly the lateral component IL since the current value IV becomes a base current by being recombined in the base area 15.

To increase a current amplification factor $h_{FE}$ of a lateral transistor, it is enough to make the bottom area of the emitter area 16 small so as to reduce a current value IV flowing into the base electrode 19 diffusing in the base area 15 from the bottom of the emitter area, which hardly contributes to the operation of the transistor. However, when the bottom area of the emitter area 16 is reduced, a peripheral length as well as the side area of the emitter area 16 is also reduced. Therefore, even the current amplification factor itself can be promoted, an absolute value of the current value IL flowing from the emitter area 16 to the collector area 17 also decreases.

Suppose, for instance, the size of the emitter area 16 is about 3 $\mu m^2$ and a current amplification factor $h_{FE}$ is 100, only 1~10 $\mu A$ of collector current is obtained. Thus, the decrease of an absolute value of collector current of a transistor generates such a problem that sufficient current capacity is not obtained when a transistor is used in a power circuit and thus a power circuit having a sufficient load driving capacity is not obtained.

Further, when a lateral transistor is used as a high frequency amplifying device, cut-off frequency $f_T$ is desired to be high. By the way, one of factors deciding cut-off frequency $f_T$ of a transistor as a high-frequency amplifying device is the junction parasitic capacity. The bottom portion of the emitter area 16 of a lateral transistor contributes little to the transistor operation and operates to lower the cut-off frequency due to a parasitic capacity between the emitter/base junction. While in a vertical transistor, cut-off frequency of as high as 10~30 GH has been realized at present, in a lateral transistor, only about 200 MHz at the utmost has been realized.

Thus, the load driving capacity and the cut-off frequency of the lateral transistor are in a trade-off relation. That is, when the emitter area is made large in order to supply with a large current, the cut-off frequency drops because of the increased parasitic capacity. In a simple approximation, when the bottom area of the emitter area is increased to two time, the parasitic capacity of the emitter/base junction becomes four times.

Accordingly, an object of the present invention is to provide a lateral transistor with an improved load driving capacity and a cut-off frequency.

Further, another object of the present invention is to provide a lateral transistor with an improved current amplification factor and cut-off frequency in the state where the sufficient load driving capacity is maintained.

In addition, a further object of the present invention is to achieve the above-mentioned objects with a high degree of integration and a cheap manufacturing cost.

SUMMARY OF THE INVENTION

A lateral bipolar transistor according to the present invention comprises a device area formed on a semiconductor substrate being surrounded by an isolating insulation layer, a base area formed in the device area having a specified depth from the surface of the semiconductor substrate, a core insulation layer formed in the base area in a depth from the surface of the semiconductor substrate shallower than the base area, an emitter area formed around the core insulation layer in the depth shallower than the core insulation layer, and a collector area formed in the base area at a specified distance from the emitter area in a depth shallower than the core insulation layer.

Further, in the lateral bipolar transistor according to the present invention, a bottom area of the emitter area is reduced to be less than its side area by providing the core insulation layer.

Further, in the lateral bipolar transistor according to the present invention, the emitter area is provided at a nearly center of the device area spaced from the isolating insulation layer Further, in the lateral bipolar transistor according to the present invention, on the surface of the semiconductor substrate including the emitter area formed around the core insulation layer, a surface protection film is laminated, and a contact hole is formed on the surface protection film to expose the emitter area formed around the core insulation layer so as to provide an emitter electrode in contact with the emitter area through the contact hole.

Further, in the lateral bipolar transistor of the present invention, the base contact area surrounded by the isolating insulation layer is formed on the surface of the semiconductor substrate beside the device area, and the base area is extending into the base contact area via a lower portion of the isolating insulation layer Further, in the lateral bipolar transistor of the present invention, the collector area is provided at the peripheral portion of the device area spaced from the emitter area, and a number of collector electrodes are provided on the collector area through the surface protection film.

Further, in the lateral bipolar transistor according to the present invention, a number of base electrodes are provided on the base contact area through the surface protection film.

Further, in the lateral bipolar transistor according to the present invention, the device area, the core insulation layer provided at nearly a center of the device area, the emitter area and the collector area formed around the core insulation layer have nearly rectangular patterns on the surface of the semiconductor substrate.

Further, in the lateral bipolar transistor according to the present invention, the core insulation layer is made of almost the same material as the isolating insulation layer and is formed with a depth being not less than that of the isolating insulation layer from the surface of the semiconductor substrate.

Further, in the lateral bipolar transistor according to the present invention, the base area is a well area having a different conductive type from that of the semiconductor substrate.

Further, in the lateral bipolar transistor according to the present invention, the surface protection film is laminated on the surface of the semiconductor substrate including the emitter area formed around the core insulation layer, and a plurality of contact holes are formed in the surface protection film through which a plurality of emitter electrodes are provided so as to contact with the emitter area.

Further, in the lateral bipolar transistor of the present invention, a plurality of emitter electrodes are provided partially on the core insulation layer or at positions close thereto.

Further, a lateral bipolar transistor according to the present invention comprises a device area formed on a surface of a semiconductor substrate surrounded by a isolating insulation layer, a base area formed in the device area to a specified depth from the surface of the semiconductor substrate, a core insulation layer formed in the base area to a depth from the surface of the semiconductor substrate shallower than the base area with one end being connected to the isolating insulation layer and the other end being extended into the device area, an emitter area formed around the core insulation layer with a depth shallower than the core insulation layer, and a collector area formed in the base area spaced at a specified distance to the emitter area with a depth shallower than the core insulation layer.

Further, in the lateral bipolar transistor according to the present invention, the device area is formed in the U-shape around the core insulation layer.

Further, in the lateral bipolar transistor according to the present invention, a base contact area surrounded by the isolating insulation layer is formed on the surface of the semiconductor substrate beside the device area, and the base area is extended into the base contact area via the lower portion of the isolating insulation layer Further, in the lateral bipolar transistor of the present invention, the base contact area is formed in an U-shape around the device area.

Further, in the lateral bipolar transistor according to the present invention, a surface protection film is laminated on the surface of the semiconductor substrate including the emitter area and the collector area formed around the core insulation layer, and a plurality of contact holes are formed in the surface protection film on the emitter area and the collector area formed around the core insulation layer. A plurality of emitter electrodes are provided so as to contact with the emitter area through the contact holes, and a number of collector electrodes are provided so as to contact with the collector area through the contact holes.

Further, in the lateral bipolar transistor according to the present invention, the emitter electrodes are partially provided on the core insulation layer or at positions close thereto.

Further, in the lateral bipolar transistor according to the present invention, the collector electrodes are partially provided on the isolating insulation layer or positions close thereto.

Further, in the lateral bipolar transistor according to the present invention, a plurality of base electrodes are provided on the base contact area through the surface protection film.

Further, in the lateral bipolar transistor according to the present invention, the device area is nearly rectangular and the core insulation layer of which one end is extended in the device area is nearly rectangular in the surface of the semiconductor substrate.

Further, in the lateral bipolar transistor according to the present invention, the core insulation layer is made of almost the same material as the isolating insulation layer and is formed in the depth being not less than that of the isolating insulation layer from the surface of the semiconductor substrate.

Further, in the lateral bipolar transistor according to the present invention, the base area is a well area having a differing conductive type from the semiconductor substrate.

A method for manufacturing a lateral bipolar transistor according to the present invention comprises steps of forming a mask pattern on a surface of a semiconductor substrate covering a device area to be formed on the semiconductor substrate, a base contact area and a core insulation layer area to be formed in the device area, etching the surface of the semiconductor substrate through the mask pattern to form recesses thereon, laminating an oxide film on the surface of the semiconductor substrate after removing the mask pattern, exposing the surface of the semiconductor substrate by polishing the oxide film to leave the isolating insulation layer and the core insulation layer in the recesses formed in the etching step, forming a well area having a first conductive type in a specified depth from the surface of the semiconductor substrate at the device area and the base contact area surrounded by the isolating insulation layer, and forming an emitter area and a collector area having a second conductive type in the well area.

Further, in the method for manufacturing a lateral bipolar transistor according to the present invention, the core insulation layer is formed with the same material, quality and thickness as the isolating insulation layer Further, in the method for manufacturing a lateral bipolar transistor according to the present invention, the emitter area is formed in the well area around the core insulation layer.

Further, in the method for manufacturing a lateral bipolar transistor according to the present invention, the emitter area is formed with a depth shallower than the dept of the core insulation layer.

BRIEF DESCRIPTION OF THE DRAWINGS

FIG. 1(A) is a plan view and FIG. 1(B) is a cross-sectional view along the doted chain line A–A' in FIG. 1(A);

FIG. 2(A) is a plan view and FIG. 2(B) is a cross-sectional view along the doted chain line A–A' in FIG. 2(A);

DETAILED DESCRIPTION OF THE INVENTION

Figure 1:
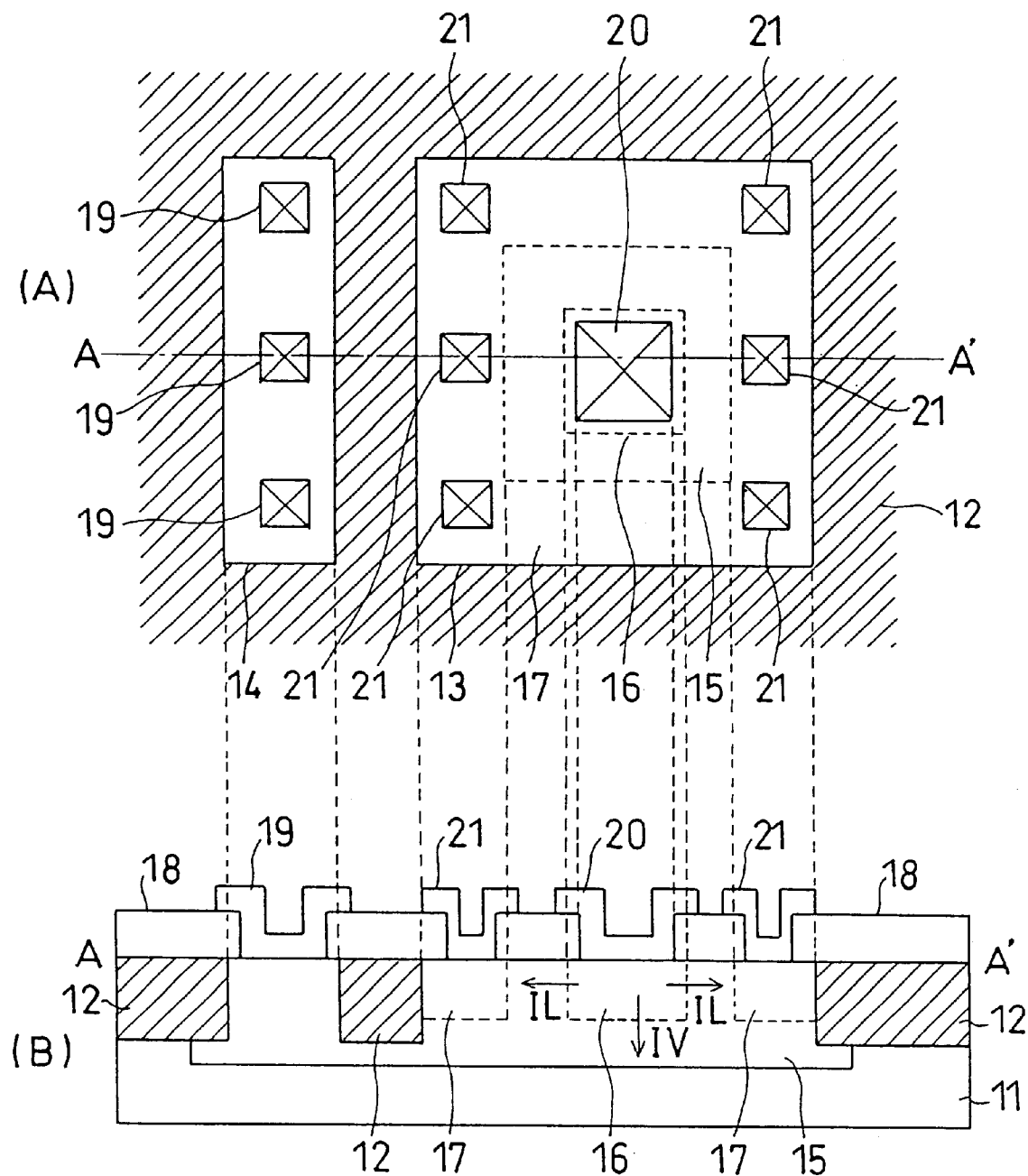
FIG. 1 shows the structure of a conventional lateral bipolar transistor.
Figure 2:
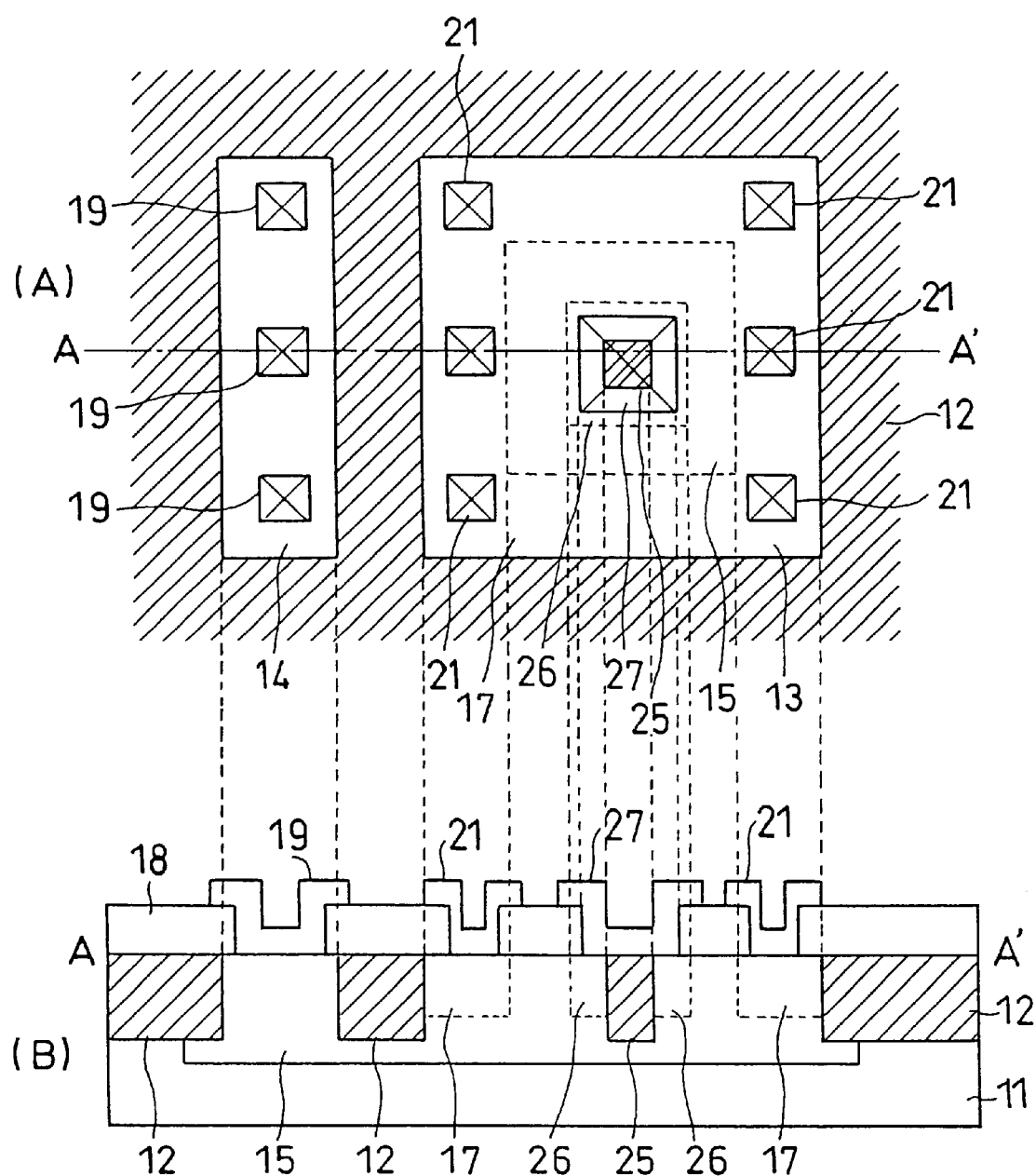
FIG. 2 shows a lateral bipolar transistor according to an embodiment of the present invention.

Preferred embodiments of the present invention will be described below in detail with reference to accompanied drawings. FIG. 2 shows the structure of a lateral bipolar transistor according to a first embodiment of the present invention. FIG. 2(A) is a plan view and FIG. 2(B) is a cross-sectional view along the doted chain line A–A' shown in FIG. 2(A). Here, a PNP transistor is shown as an example. However, needless to say, the present invention is not restricted to PNP transistors but is also applicable to NPN transistors. Further, in the description shown below, those portions corresponding to the structure of the conventional PNP transistor shown in FIG. 1 are assigned with the same reference numerals.

On a P-type semiconductor substrate 11, a square device area 13 and a rectangular base contact area 14 are formed by an isolating insulation layer 12 formed in a specified depth from its surface. In the device area 13 and the base contact area 14, an N-type base area 15 is formed on the entire area. The base area 15 is formed to a depth deeper than the thickness of the insulation layer 12 from the surface of the semiconductor substrate 11 as shown in FIG. 2(B), its lower end extending under a bottom surface of the insulation layer 12, forming a well area as an entirety.

Then, at the central portion of the device area 13, a square core insulation layer 25 is formed in the same depth as the isolating insulation layer 12 as shown in FIG. 2(A). Around this core insulation layer 25, a square P-type emitter area 26 is formed as shown in FIG. 2(A). The emitter area 26 is formed at a portion shallower than the thickness of the core insulation layer 25 from the surface of the semiconductor substrate 11 as shown in FIG. 2(B) and has a ring shaped area having a square outer and inner peripheries as an entirety. The P-type emitter area 26 is also formed in the N-type base area 12. Further, in the device area 13 around the emitter area 26, the P-type collector area 17 is formed at a specified distance from the emitter area 26. The collector area 17 is also formed in the N-type base area 12 in the almost same thickness as the emitter area 16.

On the surface of the semiconductor substrate 11 where the base area 15, the emitter area 26 and the collector area 17 are thus formed, the surface protection oxide film 18 is formed. Contact holes are formed in the oxide film 18 at the portion where the base area 15, the emitter area 26 and a collector area 27 are formed. Base electrodes 19, emitter electrodes 22 and collector electrodes 21 are formed through these contact holes. Here, an emitter electrode 27 has a larger area than that of a core insulation layer 25 so as to contact with the surface of the emitter area 26 around the core insulation layer 25.

The operations of the lateral PNP bipolar transistor of the present invention with the structure as described above will be explained. The current I injected into the base area 15 is a sum of the current IL flowing into the collector area 17 from the side of the emitter area 26 and the current Iv diffused in the base area 15 from the bottom of the emitter area 26 and flowing into the base electrode 19. However, the emitter area 26 has the smaller bottom area than that of the conventional emitter area 16 because the core insulation layer 25 is formed on its central portion and the current Iv becomes smaller than a conventional lateral transistor. On the contrary, the side area of the emitter area 26 is the same as that of a conventional lateral PNP transistor and the current IL is maintained at the same level. Therefore, according to the lateral bipolar transistor of the present invention, the current amplification factor $h_{FE}$ can be increased by improving the emitter injection efficiency, that is, while maintaining a large collector current.

Further, according to the lateral bipolar transistor according to the present invention, as the bottom area of the emitter area 26 becomes small, a parasitic capacity of the emitter/base junction decreases and cut-off frequency can be made large.

Figure 3:
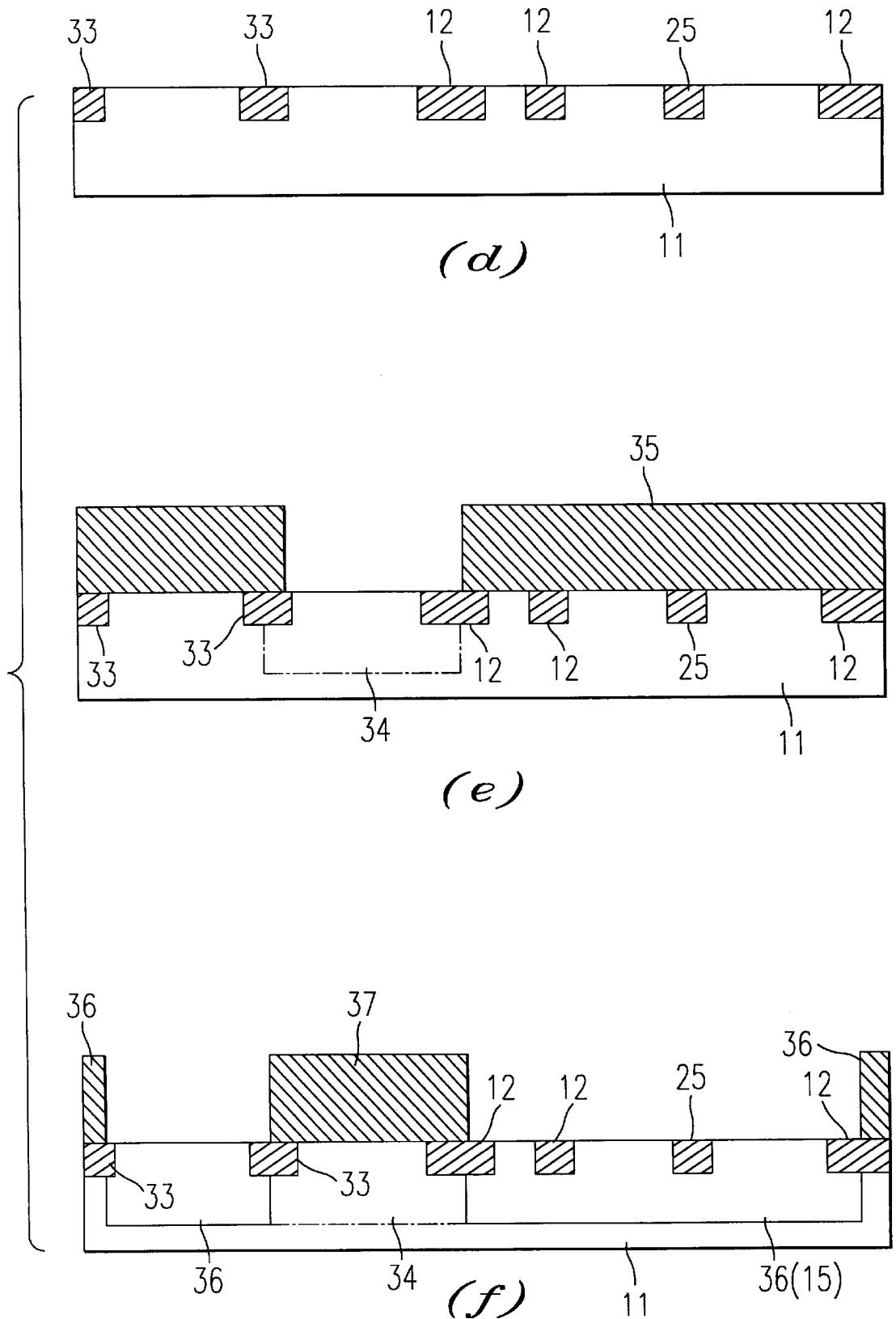
FIG. 3 is a cross-sectional view of a device showing the manufacturing steps for the lateral bipolar transistor according to the present invention shown in FIG. 2.
Figure 3:
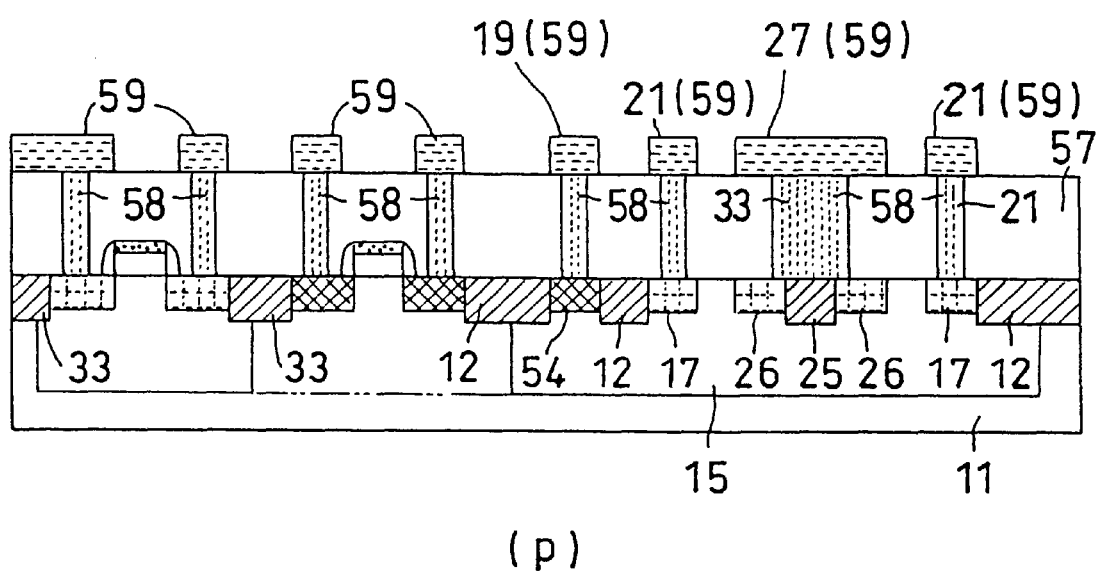

FIG. 3 is a cross-sectional view of the lateral bipolar transistor showing a process for manufacturing thereof according to the present invention shown in FIG. 2. The method for manufacturing a MOS semiconductor integrated circuit including, as one of its parts, the lateral bipolar transistor of the present invention will be explained bellow, referring to FIG. 3.

A P-type semiconductor silicon substrate 11 is prepared for forming a laminated insulation layer 31. On the overall surface of the semiconductor substrate 11 a first silicon oxide film, silicon nitride film and a second silicon oxide film are laminated sequentially. That is, a 15 nm thick first silicon oxide film is form by oxidizing the semiconductor substrate 11, at first. In the next, a silicon nitride film in 150 nm thick and a second silicon oxide film in 100 nm thick are laminated and are subject to a heat treatment in an oxidizing atmosphere at 900° C. Thereafter, the laminated insulation film 31 is formed on a surface thereof and is etched by the reactive ion etching (hereinafter referred to as RIE) through a photo-resist pattern 32 (FIG. 3(a)).

After removing the photo-resist pattern 32, the P-type silicon substrate 11 is etched by the RIE to a depth 400 nm from the surface of the silicon substrate using the etched laminated insulation film 31 as a mask (FIG. 3(b)).

Then, the surface of the silicon substrate 11 is improved by forming a 15 nm thick third silicon oxide film thereon in the oxidizing atmosphere at 1000° C. and laminate a 670 nm thick fourth silicon oxide film 33 is laminated thereon using a CVD process (FIG. 3(c)).

The fourth silicon oxide film 33 thus formed is polished and a silicon nitride film (not shown) included in the laminated insulation film 31 is exposed. The silicon nitride film exposed on the surface of the silicon substrate 11 is removed using a heated phosphate solution. Then, the silicon substrate 11 is exposed in a 750° C. oxidizing atmosphere. The condition at this time is that the P-type silicon substrate is oxidized to form a silicon oxide of 8 nm thick. Thereafter, the silicon substrate 11 is subject to a 1100° C. dry nitride atmosphere, to densify the surfaces of the silicon oxide films 33 by heat oxidizing. The portions shown by Nos. 12 and 25 of the silicon oxide films 33 embedded in the grooves on the surface of the silicon substrate 11 correspond to the isolating insulation layer 12 and the core insulation layer 25 shown in FIG. 2.

Then, removing a first silicon oxide film (not shown) forming the laminated insulation film 31 to expose the surface of the silicon substrate 11, a fifth silicon oxide film of 8 nm thick (not shown) is formed in the oxidizing atmosphere. The fifth silicon oxide film improves the surface of the silicon substrate 11 and the channel portion of a MOS transistor is formed on this portion as described later (FIG. 3 (d)).

Then, a photo-resist pattern 35 having an opening in an area to form the P-type well 34 is formed through which boron ions are implanted by the ion implantation. The condition of the implantation is that, for instance, an injection density is $8\times10^{12}$ cm$^{-2}$ to $2\times10^{13}$ cm$^{-2}$ and an accelerating energy is 20 to 400 keV (FIG. 3 (e)).

After peeling off the photo-resist pattern 35, a photo-resist pattern 37 having an opening in an area to form an N-type well 36 is formed through which phosphorus ions are implanted by the ion implantation. The condition of the ion implantation is that, for instance, the injection density is $5\times10^{12}$ cm$^{-2}$ to $2\times10^{13}$ cm$^{-2}$ and the accelerating energy is 60 to 800 keV (FIG. 3 (f)).

Here, a N-type well 36 shown at a right hand side of FIG. 3(f) corresponds to the N-type base area 15 in FIG. 2. Therefore, this area is also called as the base area 15 bellow.

After removing the photo-resist pattern 37, a heat process for 30 seconds at 1000° C. is applied. Then, a poly-crystal silicon film 38 is laminated with a thickness of 250 nm on the surface of the semiconductor substrate 11. Phosphorus atoms are diffused into the poly-crystal silicon film 38 with a density of $2\times10^{20}$ cm$^{-3}$ at 900° C. After the thermal diffusion is completed, the silicon oxide film formed on the poly-crystal silicon film 38 is removed with dilute fluoric acid solution. A tungsten silicide (hereinafter referred to as WSi) film 39 is then laminated using a spattering process with a thickness of 200 nm (FIG. 3 (g)).

A photo-resist pattern 43 is formed for patterning gate electrodes 41, 42 of a MOS transistor. The gate electrodes 41, 42 are formed by a laminated film laminating the poly-crystal silicon film 38 and WSi film 39, in succession, and by being etched through the photo-resist pattern 43 using the RIE (FIG. 3 (h)).

After removing the photo-resist pattern 43 on the gate electrodes 41, 42 of the MOS transistor, a heat treatment is perform at 850° C. for 10 min. in a dry oxidizing atmosphere. Then, a photo-resist pattern 44 is formed which has an opening at a portion including the gate electrode 42 of an N-channel MOS transistor and a portion where the base electrodes of a lateral PNP transistor are provided, respectively. A LDD (lightly doped drain) area 45 is then formed by adding arsenic ions by the ion implantation under the condition of, for instance, about injection density of $5\times10^{14}$ cm$^{-2}$ at accelerating energy of 20 keV (FIG. 3 (i)).

A LDD area 45 formed at the base electrode of the lateral PNP transistor is provided for improving an electric contact with the base electrode 19 although it is not shown in FIG. 2.

After removing the photo-resist pattern 44, a photo-resist pattern 46 is formed having an opening at a portion where a P-channel MOS transistor including the gate 41 is formed. Then, a LDD area 47 of the P-channel MOS transistor is formed by adding boron ions under the condition that the injection density is about $2\times10^{14}$ cm$^{-2}$ and the accelerating energy is 20 keV (FIG. 3(j)).

After removing the photo-resist pattern 46, silicon nitride film 48 is laminated at a 100 nm thick on the overall surface of the semiconductor substrate 11 (FIG. 3(k)).

Etching the overall surface of the semiconductor substrate 11 by the RIE, the silicon nitride film 48 is removed leaving side walls 51, 52 of the gate electrodes 41, 42 of the MOS transistor (FIG. 3(l)).

A photo-resist pattern 53 is formed having an opening at a portion where the gate electrode 42 and the base electrode of the lateral PNP transistor are formed. AN-type area 54 is formed then by adding arsenic ions using the ion implantation under the condition that the injection density is about $5\times10^{14}$ cm$^{-2}$ and the acceleration energy is 60 keV (FIG. 3(m)).

Here the N-type area 54 formed at the base electrode is provided for the purpose of improving an electric contact with the base electrode 19 similar to the above-mentioned LDD area 45 although it is not shown in FIG. 2.

A photo-resist pattern 55 is formed having an opening at a portion where the P-channel MOS transistor including gate electrode 41 are formed and at a portion where the emitter and the collector electrode of the lateral PNP transistor are formed. A P-type area 56 is formed by adding boron fluoride ions through the photo-resist pattern 55 under the condition that the injection density is, for instance, about $2\times10^{15}$ cm$^{-2}$ and the acceleration energy is 20 keV. After removing the photo-resist pattern 55, a heat treatment is performed at 1000° C. for 20 seconds in a nitride atmosphere (FIG. 3(n)).

Further, P-type areas 56 formed in the base area 15 shown in FIG. 3(n) correspond to the emitter area 26 and the collector area 17 shown in FIG.2, respectively. So, in the drawings shown below, these areas are referenced by using these reference numerals.

After laminating a fifth silicon oxide film 57 with a thickness of 800 nm on the surface of the semiconductor substrate 11, the surface is made flat by polishing. The substrate 11 is then subject to a heat treatment at 700° C. for 30 min. in the nitrogen atmosphere (FIG. 3(o)).

Contact holes 58 are formed in the fifth silicon oxide film 57 at the N-type area 54 and P-type area 56, through which Al electrodes 59 are formed (FIG. 3(p)).

Among these Al electrodes 59, Al electrodes 59 in contact with the base area 15, the collector area 17 and the emitter area 26 correspond to the base electrode 19, the collector electrode 21 and the emitter electrode 33 in FIG. 2, respectively and therefore, these numbers are shown jointly with (59).

In replace of these Al 59, other type of electrodes may be provided such as electrodes formed by filling the contact holes 58 with tungsten on which Al wiring is formed as a first layer wiring. Further, an insulation film may be laminated on which a second layer wiring may be formed if necessary.

Figure 4:
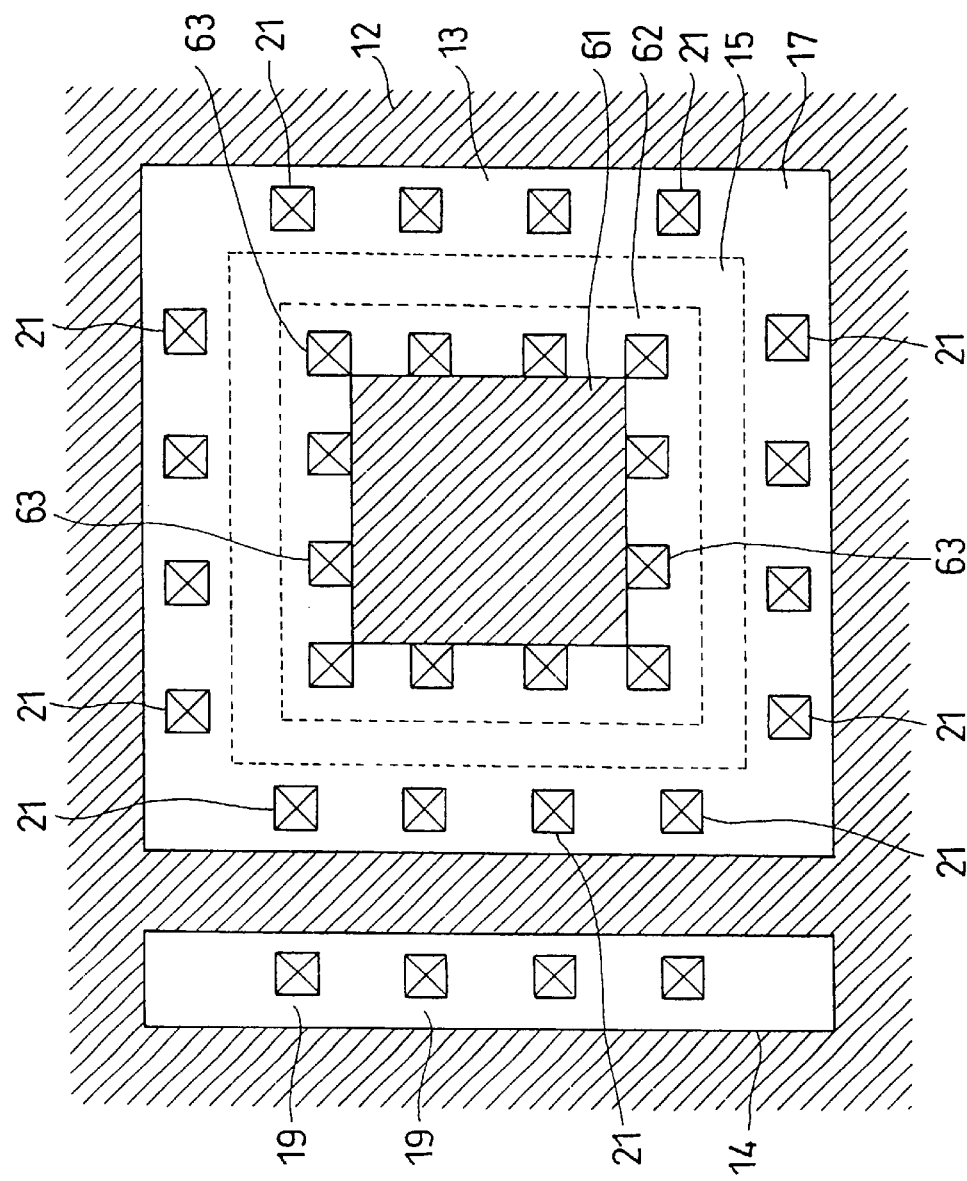
FIG. 4 is a plan view of a lateral PNP transistor showing a second embodiment of the present invention.

FIG. 4 is a plan view of a lateral PNP transistor showing a second embodiment of the present invention. The structure of this transistor is basically the same as that of the transistor shown in FIG. 2(B) but differs mainly in that the overall area of the transistor including the device area 13 and the base contact area 14 is enlarged and the area of the emitter area 62 provided at the center of the device area 13 is also enlarged. Therefore, in FIG. 4, the portions corresponding to the component elements shown in FIG. 2 are assigned with the same reference numerals and the detailed explanation thereof will be omitted. Portions different from those shown in FIG. 2 will be explained in the following.

A square core insulation layer 61 having an enlarged area is provided at the center of the device area 13 and similarly, a square frame like emitter area 62 is formed around it. On the surface of the emitter area 62, a number of emitter electrodes 63 are provided through contact holes that formed in the surface protection oxide film 18 shown in FIG. 2. These emitter electrodes 63 are distributed over the entire surface of the emitter area 62. Further, each of these emitter electrodes 63 is provided closely at a periphery of the center core insulation layer 61. With the enlargement of the entire device area, the collector electrodes 21 provided in the collector area 17 are also distributed along the entire circumferential length of the area. Similarly, a plurality of base electrodes 19 provided in the base contact area 14 are also increased. Further, the cross-sectional structure of the lateral transistor, in particular, the relation of the depth of the insulation layer and respective areas is the same as that shown in FIG. 2(B). That is, the depth of the emitter area 62 is shallower than the dept of the core insulation layer 61.

With the lateral transistor according to the present invention, a current value IL flowing from the side wall of the emitter area 62 to the collector area 17 becomes relatively large and thus a transistor of high driving capacity is obtained, since the side area is further enlarged compared with the bottom area of the emitter area.

Figure 5:
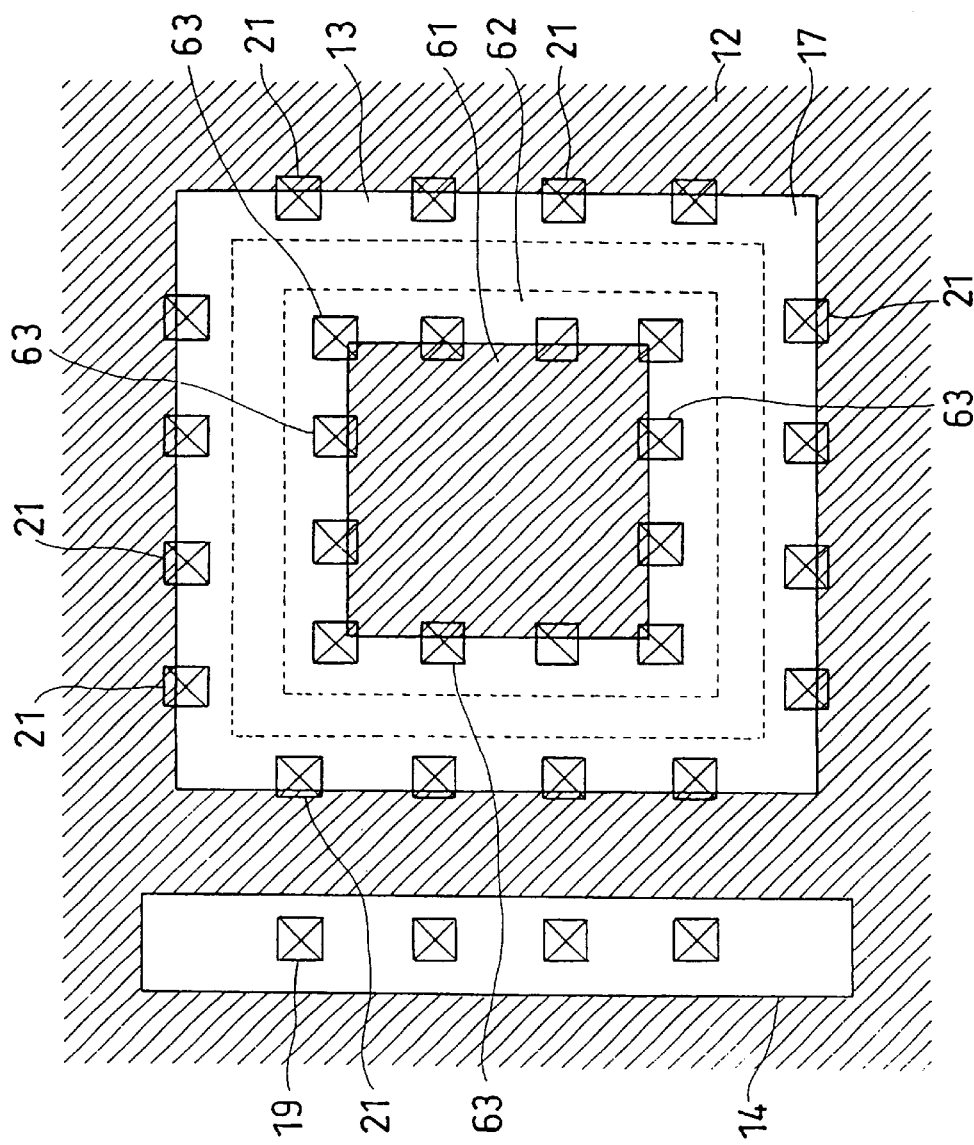
FIG. 5 is a plan view of a lateral PNP transistor showing a third embodiment of the present invention.

FIG. 5 shows a third embodiment of the present invention. As the plan view of the transistor is similar to the plan view of the lateral PNP transistor shown in FIG. 4, those portions corresponding to the component elements shown in FIG. 4 are assigned with the same reference numerals. The detailed explanation thereof will be omitted, and mainly those portions differing from FIG. 4 will be explained in the following.

In the lateral PNP transistor of the embodiment, the emitter areas 62 and the collector areas 17 have a narrower width than those shown in FIG. 4, while the core insulation layer 61 has a wider area than the lateral PNP transistor shown in FIG. 4. The emitter electrodes 63 and the collector areas 21 are differently positioned in the respective area. As the area of the core insulation layer 61 is enlarged, the length of periphery of the emitter area 62 becomes large and its side area is also enlarged. Accordingly, the current value IL flowing from the side of the emitter area 62 to the collector area 17 becomes relatively large and a transistor of more higher driving capacity is obtained. However, the widths of the emitter area 62 and the collector area 17 are reduced, since the resulting increase in the entire device area is not desirable. A number of emitter electrodes 63 provided on the emitter area 62 through the surface protection oxide film (18 in FIG. 2) are provided so as to partially overlap the core insulation layer 61. That is, these emitter electrodes 63 are placed at the boundary overlapping with both of the emitter area 62 and the core insulation layer 61. Similarly, a number of collector electrodes 21 provided on the collector area 17 through the surface protection oxide film are placed so as to partially overlapping with the isolating insulation layer 12. That is, these collector electrodes 21 are provided at the boundary of the collector area and the isolating insulation layer 12 overlapping with both of them. As a result of such arrangement of the electrodes, an alignment process becomes easy to form a number of contact holes in the surface protection oxide film through which electrodes are formed, thereby enabling high integration.

Thus, the lateral PNP transistor according to the third embodiment of the present invention is able to supply large driving current with a small device area.

Figure 6:
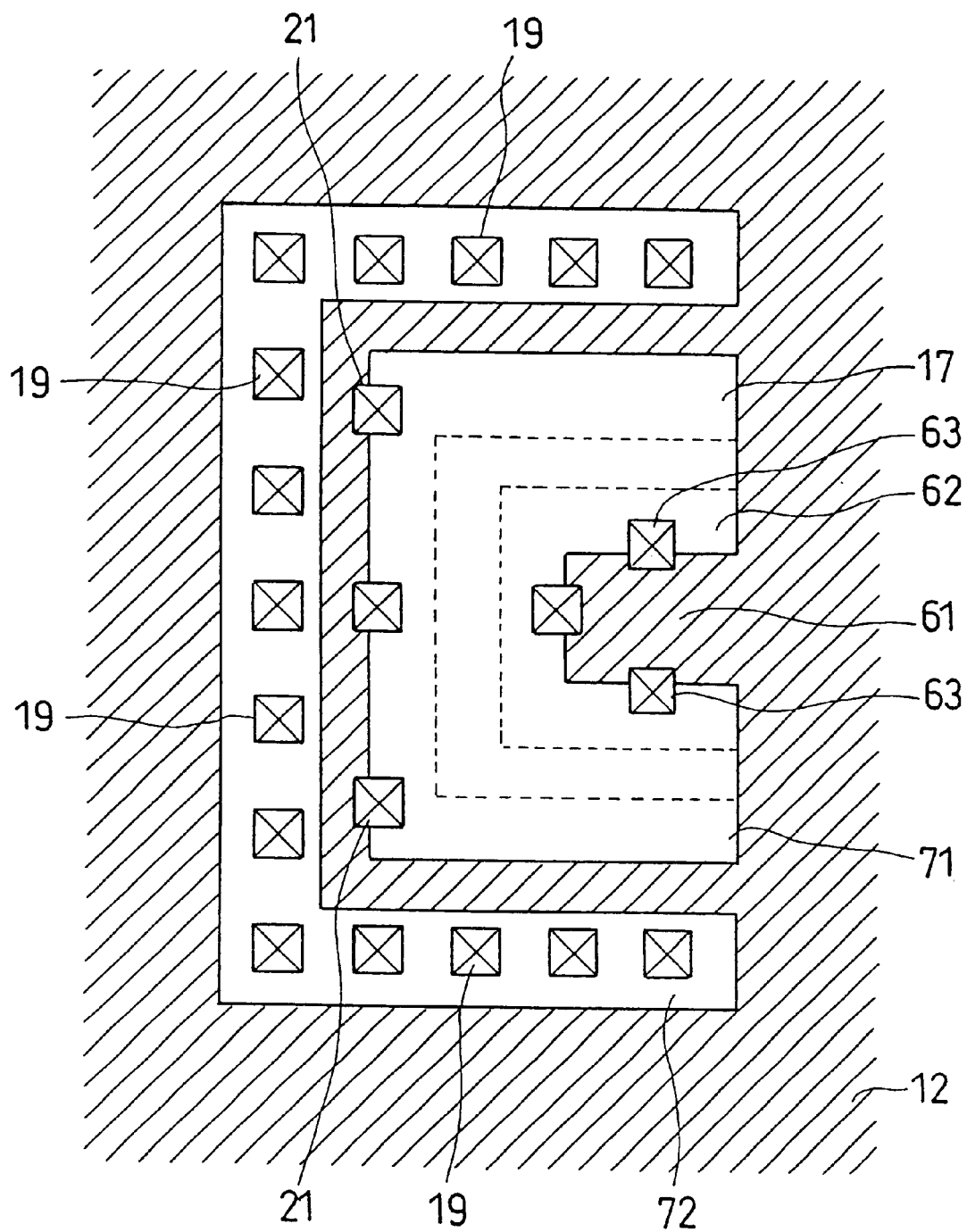
FIG. 6 is a plan view of a lateral PNP transistor showing a fourth embodiment of the present invention.

FIG. 6 is a plan view showing a fourth embodiment of the present invention. The plane view of the transistor is similar to a half portion of the transistor shown in FIG. 4. A base contact area 72 has a different shape from the base contact area 14 shown in FIG. 4 in that both ends are extended around the device area 71. Accordingly, in FIG. 6 those portions corresponding to the component elements shown in FIG. 4 are assigned with the same reference numerals. The detail explanation, therefore, will be omitted and those elements differing from those shown in FIG. 4 will be explained in the following.

In this embodiment, the core insulation layer 61 extended into the central part of the device area 71 from its side has a rectangular shape as a while. The P-type emitter area 62 and the P-type collector area 17 are formed in the U-shape around the core insulation layer 61, respectively. A number of emitter electrodes 63 on the emitter area 62 are provided around the core insulation layer 61 being partially extended on the surface of the core insulation layer 61. Further, a number of collector electrodes 21 on the collector area 17 are provided at nearly equal spaces along the overall length being partially extended on the surface of the insulation layer 12 surrounding the collector area 17. The base electrodes 19 are provided along the overall length of the base contact area 72 extending around the device area 71.

The entire device area of the lateral transistor in this structure of the present invention can be made smaller than the lateral transistor shown in FIG. 4. That is, in the lateral transistor, the size of the device area 71 is about half of the transistor and the sizes of the emitter area 62 and the collector area 17 become narrow. However, as the emitter electrodes 63 and the collector electrodes 21 are partially formed on the adjacent core insulation layer 61 or the isolating insulation layer 12, the mask alignment at the time when forming electrodes becomes easy. Thus, integrated circuits of high degree of integration can be manufactured.

The present invention is not restricted to the embodiments described above but is applicable to various modifications. For instance, in the above-mentioned embodiments, a PNP transistor is described as a lateral transistor but the present invention is also applicable to an NPN transistor. In addition, the pattern of a lateral transistor is not restricted to the above-mentioned embodiments but other different patterns can be adopted.

According to the lateral transistor of the present invention described above, various advantages such as shown below are obtained.

(1) With the enlarged side area of the emitter area and with the decreased PN junction area at the bottom of the emitter area of the transistor which does not contribute to the current amplifying operation, it becomes possible to increase the current driving capacity and to improve the current amplification factor.

(2) With the reduced PN junction area at the bottom of the emitter area and with the reduced emitter/base parasitic capacity, it is possible to improve the cut-off frequency when amplifying high-frequency signal.

(3) When the lateral transistor of the present invention is used for a power circuit, the current driving capacity of the transistor is improved. It is, therefore, possible to reduce a plurality of transistors provided for supplying required driving current. It is also possible to achieve a high integration and to reduce a manufacturing cost.

What is claimed is:

1. A lateral bipolar transistor comprising;
a device area formed on a semiconductor substrate being surrounded by an isolating insulation layer,
a base area formed in said device area having a specified depth from a surface of said semiconductor substrate,
a core insulation layer formed in said base area in a depth from the surface of said semiconductor substrate shallower than said base area,
an emitter area formed around said core insulation layer in a depth shallower than the depth of said core insulation layer, and
a collector area formed in said base area at a specified distance from said emitter area in a depth shallower than said core insulation layer.

2. The lateral bipolar transistor claimed in claim 1, wherein a bottom area of said emitter area is reduced to be less than its side area by providing said core insulation layer.

3. The lateral bipolar transistor claimed in claim 2, wherein a surface protection film is laminated on the surface of said semiconductor substrate including the emitter area formed around the core insulation layer, and a contact hole is formed in said surface protection film to expose the emitter area formed around said core insulation layer, thereby providing an emitter electrode which is in contact with said emitter area through said contact hole.

4. The lateral bipolar transistor claimed in claim 3, wherein said base contact area surrounded by said isolating insulation layer is formed beside said device area on the surface of said semiconductor substrate, and said base area is extending into said base contact area via a lower portion of said isolating insulation layer .

5. The lateral bipolar transistor claimed in claim 4, wherein said collector area is provided at a peripheral portion of said device area spaced from said emitter area, and a number of collector electrodes are provided on said collector area through said surface protection film.

6. The lateral bipolar transistor claimed in claim 5, wherein a plurality of base electrodes are provided on said base contact area through said surface protection film.

7. The lateral bipolar transistor claimed in claim 6, wherein said device area, said core insulation layer provided at nearly a center of said device area, said emitter area and said collector area formed around said core insulation layer have nearly rectangular patterns on the surface of said semiconductor substrate.

8. The lateral bipolar transistor claimed in claim 7, wherein said core insulation layer is made of almost the same material as the isolating insulation layer and is formed with a depth being not less than that of the isolating insulation layer from the surface of said semiconductor substrate.

9. The lateral bipolar transistor claimed in claim 8, wherein said base area is a well area having a different conductive type from that of said semiconductor substrate.

10. The lateral bipolar transistor claimed in claim 9, wherein a plurality of emitter electrodes are provided partially on the core insulation layer or at positions close thereto.

11. A lateral bipolar transistor comprising:
a device area formed on a surface of a semiconductor substrate surrounded by a isolating insulation layer,
a base area formed in said device area to a specified depth from the surface of said semiconductor substrate,
a core insulation layer formed in said base area to a depth from the surface of the semiconductor substrate shallower than said base area with one end being connected to said isolating insulation layer and the other end being extended into said device area,
an emitter area formed around said core insulation layer with a depth shallower than said core insulation layer, and
a collector area formed in said base area spaced from said emitter area with a depth shallower than said core insulation layer.

12. The lateral bipolar transistor claimed in claim 11, wherein said device area is formed in an U-shape around said core insulation layer.

13. The lateral bipolar transistor claimed in claim 12, wherein a base contact area surrounded by said isolating insulation layer is formed on the surface of said semiconductor substrate beside said device area, and said base area is extended into said base contact area via a lower portion of said isolating insulation layer.

14. The lateral bipolar transistor claimed in claim 13, wherein said base contact area is formed in an U-shape around said device area.

15. The lateral bipolar transistor claimed in claim 14, further comprising:
a surface protection film laminated on the surface of said semiconductor substrate including said emitter area and said collector area formed around said core insulation layer,
a plurality of contact holes formed in said surface protection film on said emitter area and said collector area formed around said core insulation layer,
a plurality of emitter electrodes provided so as to contact with said emitter area through said contact holes, and
a plurality of collector electrodes provided so as to contact with said collector area through said contact holes.

16. The lateral bipolar transistor claimed in claim 15, wherein said core insulation layer is made of almost the same material as the isolating insulation layer and is formed in the depth being not less than that of the isolating insulation layer from the surface of the semiconductor substrate.

* * * * *

UNITED STATES PATENT AND TRADEMARK OFFICE
CERTIFICATE OF CORRECTION

PATENT NO.    : 6,365,957 B1
DATED         : April 2, 2002
INVENTOR(S)   : Hiroyuki Miyakawa It is certified that error appears in the above-identified patent and that said Letters Patent is hereby corrected as shown below:

<u>Title page,</u>
Item [56], References Cited, FOREIGN PATENT DOCUMENTS, please add the following references:
-- 2-139961      05/29/90       Japan --

Signed and Sealed this

Fifteenth Day of October, 2002

Attest:

JAMES E. ROGAN
Attesting Officer    Director of the United States Patent and Trademark Office